(12) United States Patent
Matsuura et al.

(10) Patent No.: US 7,038,264 B2
(45) Date of Patent: May 2, 2006

(54) SEMICONDUCTOR DEVICE AND METHOD FOR MANUFACTURING THE SAME

(75) Inventors: Katsuyoshi Matsuura, Kawasaki (JP); Hideyuki Noshiro, Kawasaki (JP); Aki Dote, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/857,846

(22) Filed: Jun. 2, 2004

(65) Prior Publication Data

US 2005/0161716 A1    Jul. 28, 2005

(30) Foreign Application Priority Data

Jan. 28, 2004  (JP)  ............... 2004-020173

(51) Int. Cl.
*H01L 29/94* (2006.01)

(52) U.S. Cl. .......................... 257/295; 438/3

(58) Field of Classification Search ............... 257/295, 257/310; 438/3
See application file for complete search history.

(56) References Cited

U.S. PATENT DOCUMENTS

| 6,342,712 | B1 * | 1/2002 | Miki et al. | 257/295 |
| 2004/0094791 | A1 * | 5/2004 | Ito et al. | 257/310 |
| 2005/0006680 | A1 * | 1/2005 | Song et al. | 257/295 |

OTHER PUBLICATIONS

Patent Abstracts of Japan, Publication No. 2002-289793, dated Oct. 4, 2002, Abstract only.

* cited by examiner

*Primary Examiner*—Douglas W Owens
(74) *Attorney, Agent, or Firm*—Armstrong, Kratz, Quintos, Hanson & Brooks, LLP (57) ABSTRACT

A first interlayer insulation film is formed, on which a $SiO_2$ cap film is then formed, and degassing of moisture in the first interlayer insulation film and the $SiO_2$ cap film is preformed by heat treatment. Then, an $Al_2O_3$ film is formed on the $SiO_2$ cap film. Subsequently, heat treatment is performed on the $Al_2O_3$ in an oxidation atmosphere, thereby accelerating oxidation of its surface. Thereafter, on the $Al_2O_3$ film, a platinum film, a PLZT film, and an $IrO_2$ film are formed and patterned, thereby forming a ferroelectric capacitor including an upper electrode, a capacity insulation film, and a lower electrode.

18 Claims, 8 Drawing Sheets

SEMICONDUCTOR DEVICE AND METHOD FOR MANUFACTURING THE SAME

CROSS-REFERENCE TO RELATED APPLICATIONS

This application is based upon and claims the benefit of priority from the prior Japanese Patent Application No. 2004-020173, filed on Jan. 28, 2004, the entire contents of which are incorporated herein by reference.

BACKGROUND OF THE INVENTION

1. Field of the Invention

The present invention relates to a semiconductor device suitable for a ferroelectric memory and a method for manufacturing the same.

2. Description of the Related Art

There are flash memories and ferroelectric memories that are known as nonvolatile memories capable of storing information even after power is turned off.

In a flash memory, a floating gate is embedded in a gate insulation film of an insulated gate electric field effect transistor (IGFET), so that data is stored by accumulating in the floating gate electric charges representing data to be stored. To write and erase the data, it is necessary to flow tunnel current passing through the insulation film, which requires a relatively high voltage.

In contrast to this, in a ferroelectric memory, data is stored through use of hysteresis characteristics of the ferroelectric. A ferroelectric capacitor having a ferroelectric film as a capacitor dielectric between a pair of electrodes generates polarization in accordance with the voltage applied between the electrodes and has spontaneous polarization even after the applied voltage is removed. When the polarity of the applied voltage is reversed, the polarity of the spontaneous polarization is also reversed. Detection of this spontaneous polarization enables data to be read. The ferroelectric memory can operate at a low voltage and be written to with reduced power and at a high speed, as compared to the flash memory.

Figure 6A:
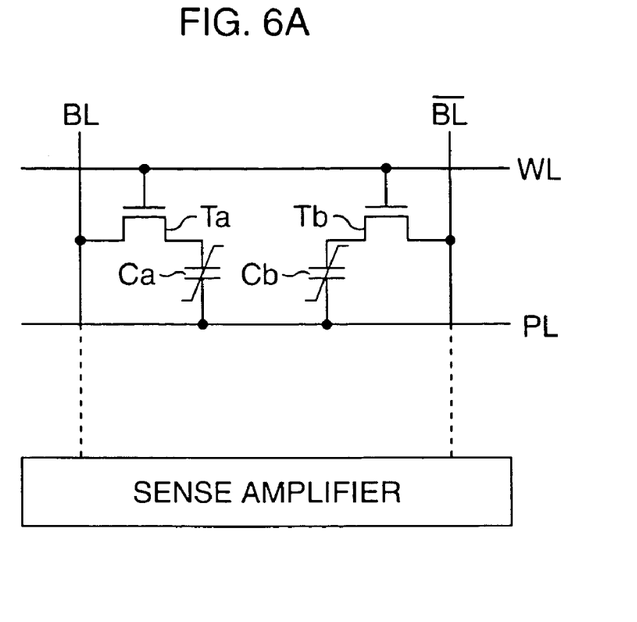
FIGS. 6A and 6B are circuit diagrams showing examples of a memory cell of an FRAM.
Figure 6B:
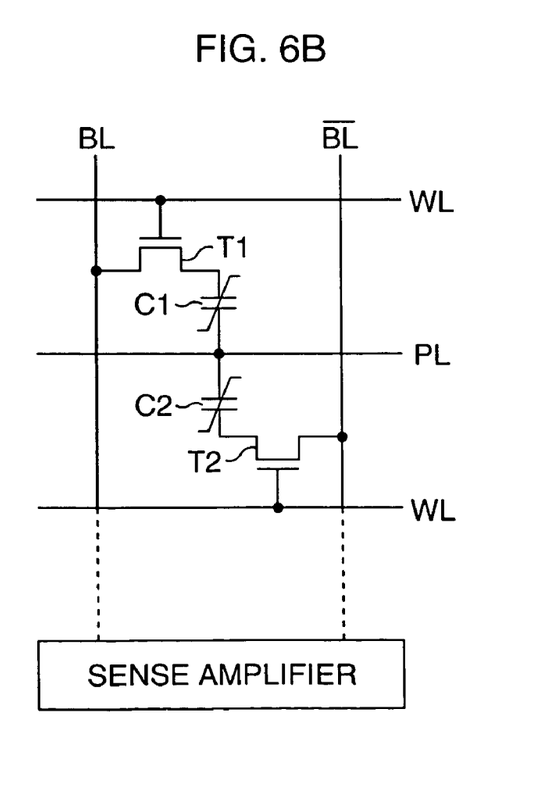

FIGS. 6A and 6B are circuit diagrams showing examples of memory cells of FRAM. The configuration shown in FIG. 6A is of a 2T/2C type using two transistors Ta and Tb and two capacitors Ca and Cb for storing one bit of data and is in general use now. In this type, such complementary operation is performed that "1" or "0" of data is stored in one capacitor Ca and reverse data is stored in the other capacitor Cb. This configuration is insusceptible to variation in process but has a cell area twice that of a 1T/1C type shown in FIG. 6B.

The configuration shown in FIG. 6B is of a 1T/1C type using one transistor T1 or T2 and one capacitor C1 or C2 for storing one bit of data. This configuration is the same as that of DRAM such that it has a small cell area and is capable of high integration.

However, it is necessary to set a reference voltage in order to judge whether the electric charge read from the memory cell represents the data of "1" or the data of "0". A reference cell which generates the reference voltage reverses the polarization every time the data is read, and therefore will degrade earlier than the memory cell due to fatigue. In addition, the 1T/1C type, in which the margin of judgment becomes narrower than that of the 2T/2C type, is susceptible to variation in process. Accordingly, this type has not been put into practical use yet.

Next, a conventional method for manufacturing a semiconductor device will be described which is suitable for manufacturing FRAMs as shown in FIGS. 6A and 6B.

The ferroelectric film of FRAM is formed from PZT based material such as lead zirconate titanate (PZT), lanthanum doped PZT (PLZT) or the like, or a bismuth layered structure compound such as $SrBi_2Ta_2O_9$ (SBT, Y1), $SrBi_2(Ta, Nb)_2O_9$ (SBTN, YZ), or the like.

As a method of forming a ferroelectric thin film, a sol-gel method or a sputtering method has been conventionally used. By these methods, a ferroelectric film in an amorphous phase is formed on a lower electrode, and then the ferroelectric film is crystallized into crystals of the perovskite structure by heat treatment.

Since the crystallization of the ferroelectric film is performed in an oxidization atmosphere, the capacitor electrode is formed from noble metal such as platinum, or $IrO_2$, $SrRuO_3$, $La_{0.5}Sr_{0.5}CoO_3$, or the like, which have conductivity even after oxidation.

To obtain a highly reliable ferroelectric capacitor, it is necessary to form a lower electrode film with high orientation because the film quality of the ferroelectric film is susceptible to crystallinity of the lower electrode film. Conventional methods include one forming a lower electrode film in a stack structure in which titanium (Ti) and platinum (Pt) are sequentially formed on an interlayer insulation film. The reason why the titanium film is formed under the platinum film in this method is to improve the adhesion between the interlayer insulation film and the platinum film. When the titanium film is not formed, there is high possibility that the platinum film peels off from the interlayer insulation film in processes after the formation of the platinum film.

The platinum film is generally formed by the sputtering method, in which if the film forming temperature is increased, the platinum film reacts with the titanium film, resulting in a platinum film not strongly self-oriented in the <111> direction but in random orientation. For this reason, the film forming temperature is set to room temperature.

However, the crystal grain size of the platinum film formed at room temperature is as small as about 20 nm, and the crystals are in a state of needle crystals. For such conditions, it is desired to make larger the crystal grain of the platinum film into columnar crystals so as to further improve the characteristics of the ferroelectric capacitor.

Hence, a method using a titanium oxide ($TiO_2$) film in place of the titanium film has been examined to form a platinum film with strong orientation at a high temperature. When using the $TiO_2$ film, the reaction of the platinum film with the $TiO_2$ film is suppressed. Accordingly, it becomes possible to form the platinum film at a high temperature of about 500° C., and as a result the crystals are strongly oriented in the <111> direction so that a platinum film can be obtained which is composed of columnar crystals with a crystal grain size as large as 100 nm to 150 nm.

However, when the $TiO_2$ film is formed on the interlayer insulation film, which has been subjected to degassing treatment, the crystallinity of the $TiO_2$ film is degraded. Then, this causes a decrease in the ability to improve the crystallinity of the platinum film, leading to insufficient improvement of the crystallinity of the ferroelectric film on the platinum film. As a result of this, high reliability cannot be obtained. The degassing treatment is treatment of removing moisture, hydrogen, and so on in the interlayer insulation film. Since the ferroelectric film is a film, which is very easily reduced, the characteristics of the ferroelectric capacitor significantly degrades with the reduction of the ferroelectric film unless the degassing treatment described above has been performed before the formation of the ferroelectric capacitor. Accordingly, even when using the $TiO_2$ film, sufficient characteristics are not obtained.

Besides, a method of improving the crystallinity of the lower electrode film is disclosed also in Patent Document 1 (Japanese Patent Application Laid-open No. 2002-289793). In the method disclosed in Patent Document 1, a $SiO_2$ film is formed on an interlayer insulation film which has been subjected to degassing treatment, and a titanium film is formed thereon. Next, the titanium film is subjected to thermal oxidation into a titanium oxide film, and a platinum film which will be a lower electrode of a ferroelectric capacitor is formed thereon. According to this method, the crystallinity of the platinum film improves.

With this conventional method, however, the orientation of the titanium film changes due to moisture (partial pressure of water) in a chamber during the film formation. In other words, the orientation of the titanium film is susceptible to moisture in a base $SiO_2$ film. Therefore, it cannot be said that the orientation of the titanium film has sufficient stability.

In Patent Document 1, a method is also disclosed which forms an $Al_2O_3$ in an amorphous state at a low temperature on an interlayer insulation film which has been subjected to degassing treatment and forms a titanium film thereon. According to this conventional method, the $Al_2O_3$ film in an amorphous state receives no effect of moisture contained in the interlayer insulation film, so that the crystallinity of the platinum film is stably improved. Further, the number of process steps is reduced by two steps of deposition and oxidation of the titanium film.

However, even in the method of forming the platinum film on the $Al_2O_3$ film, when applied to a ferroelectric memory of the 1T/1C type, stable characteristics are obtained, but the crystallinity of the platinum film cannot be said to be sufficient, so that cells with a small switching electric charge amount are locally formed, leading to difficulty of securing a sufficient reliability.

A prior art is disclosed in Japanese Patent Application Laid-open No. 2002-289793.

SUMMARY OF THE INVENTION

It is an object of the present invention to provide a semiconductor device capable of obtaining high reliability by increasing the orientation of crystals constituting a lower electrode and a method for manufacturing the same.

As a result of earnest studies to solve the above problems, the present inventor has devised various aspects described below.

In a semiconductor device according to the present invention, a silicon oxide film is formed on an interlayer insulation film with a surface planarized. An aluminum oxide film is formed on the silicon oxide film. Further, a ferroelectric capacitor is formed on the aluminum oxide film.

In a first method for manufacturing a semiconductor device according to the present invention, an interlayer insulation film is formed above a semiconductor substrate, and then a surface of the interlayer insulation film is planarized. Next, a silicon oxide film is formed on the interlayer insulation film. Subsequently, the silicon oxide film and the interlayer insulation film are heated to remove moisture from the silicon oxide film and the interlayer insulation film. Thereafter, an aluminum oxide film is formed on the silicon oxide film. Then, a ferroelectric capacitor is formed on the aluminum oxide film.

In a second method for manufacturing a semiconductor device according to the present invention, an interlayer insulation film is formed above a semiconductor substrate, and then a surface of the interlayer insulation film is planarized. Next, an aluminum oxide film is formed on the interlayer insulation film. Subsequently, the aluminum oxide film is heated in an oxidation atmosphere. Then, a ferroelectric capacitor is formed on the aluminum oxide film.

DETAILED DESCRIPTION OF THE PREFERRED EMBODIMENTS

Figure 1:
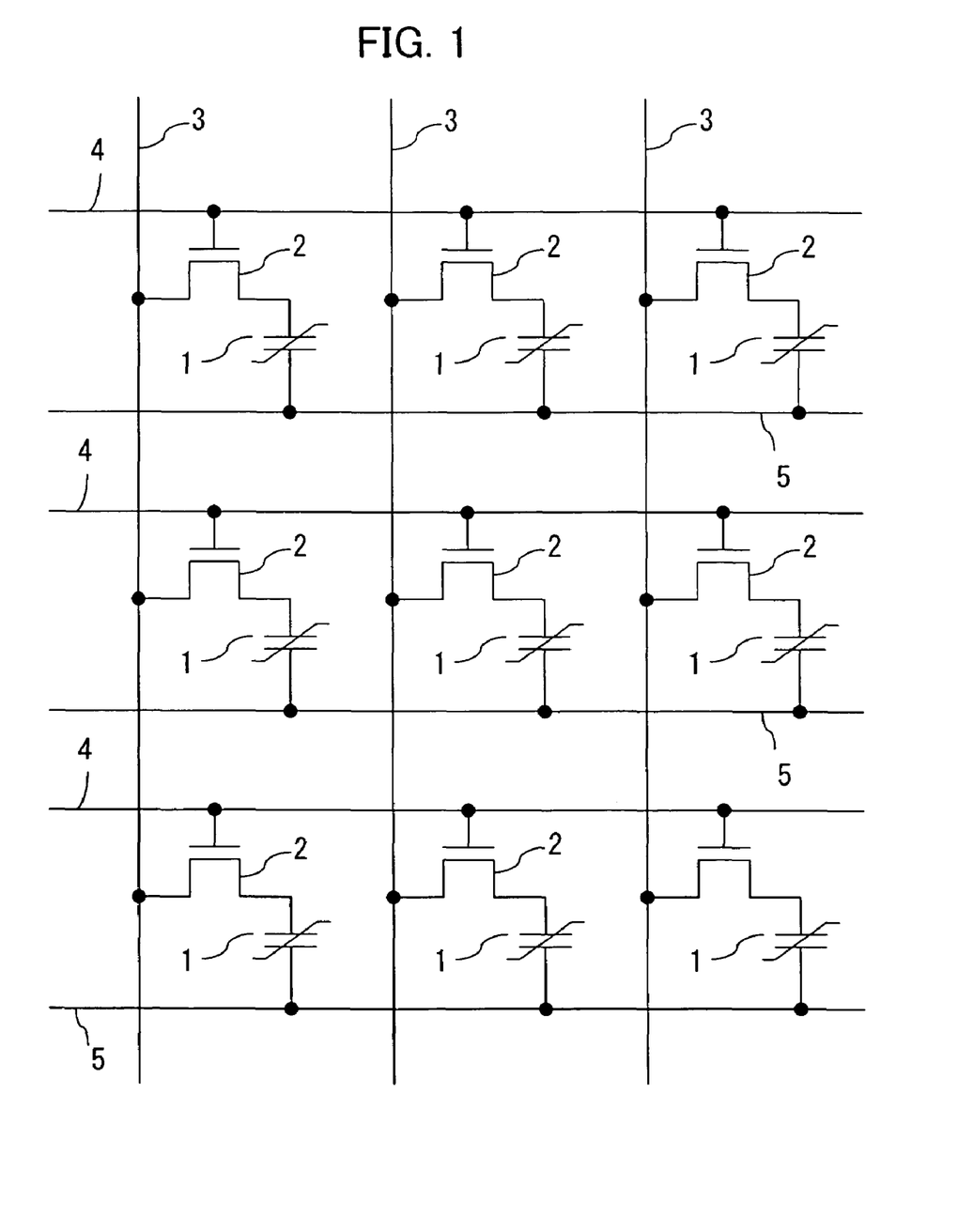
FIG. 1 is a circuit diagram showing a configuration of a memory cell array of a ferroelectric memory manufactured by a method according to an embodiment of the present invention.

Embodiments of the present invention will be concretely described below with reference to the accompanying drawings. FIG. 1 is a circuit diagram showing a configuration of a memory cell array of a ferroelectric memory (semiconductor device) manufactured by a method relating to an embodiment of the present invention.

This memory cell array is provided with a plurality of bit lines 3 extending in one direction and a plurality of words lines 4 and plate lines 5 extending in a direction perpendicular to a direction in which the bit lines 3 extend. Further, in a manner to match the grid constituted of these bit lines 3, word lines 4, and plate lines 5, a plurality of memory cells of a ferroelectric memory according to the embodiment are arranged in an array form. In each memory cell, a ferroelectric capacitor 1 and a MOS transistor 2 are provided.

The gate of the MOS transistor 2 is connected to the word line 4. Further, one source/drain of the MOS transistor 2 is connected to the bit line 3 and the other source/drain is connected to one of electrodes of the ferroelectric capacitor 1. Furthermore, the other electrode of the ferroelectric capacitor 1 is connected to the plate line 5. Note that each of the word lines 4 and plate lines 5 is shared by a plurality of MOS transistors 2 arranged side by side in the same direction as the direction in which the word line 4 and plate line 5 extend. Similarly, each of the bit lines 3 is shared by a plurality of MOS transistors 2 arranged side by side in the same direction as the direction in which the bit line 3 extends. The direction in which the word line 4 and plate line 5 extend and the direction in which the bit line 3 extends may be called a row direction and a column direction, respectively.

In the memory cell array of the ferroelectric memory thus configured, data is stored in accordance with the polarization state of a ferroelectric film provided in the ferroelectric capacitor 1.

First Embodiment

Next, a first embodiment of the present invention will be described. However, for convenience, a cross sectional structure of a ferroelectric memory will be described here in conjunction with a method for manufacturing the same. FIG. 2A to FIG. 2G are cross-sectional views showing, in the order of steps, a method for manufacturing a ferroelectric memory (semiconductor device) according to the first embodiment of the present invention.

Figure 2A:
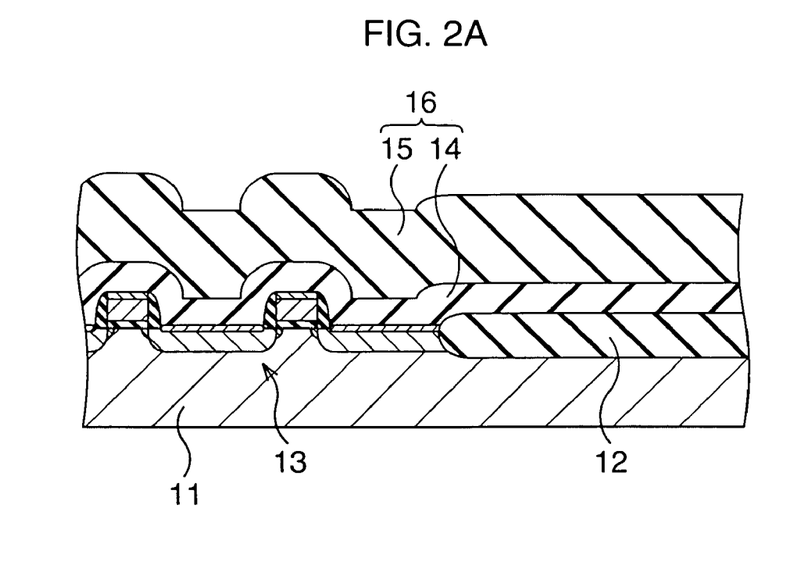
FIGS. 2A to 2G are cross-sectional views showing, in the order of steps, a method for manufacturing a ferroelectric memory according to a first embodiment of the present invention.

In this embodiment, as shown in FIG. 2A, an element isolation insulating film 12 is first formed on the surface of a silicon substrate 11. Then, impurities are selectively introduced into predetermined active regions (transistor formation regions), respectively, to form wells (not shown). The conductive type of the silicon substrate 11 may be either p-type or n-type. Subsequently, an LDD-structure CMOS transistor 13 is formed in the active region. Thereafter, an oxidation preventing film 14 covering the CMOS transistor 13 is formed by a CVD method. As the oxidation preventing 14, a SiON film is formed which has a thickness of, for example, 200 nm. Subsequently, on the oxidation preventing film 14, a $SiO_2$ film 15 having a thickness of, for example, 600 nm is formed by a CVD method. The oxidation preventing film 14 and the $SiO_2$ film 15 constitute a first interlayer insulation film 16. It should be noted that when forming the $SiO_2$ film 15, for example, TEOS (Tetraethyl orthosilicate) is used as a reaction gas.

Figure 2B:
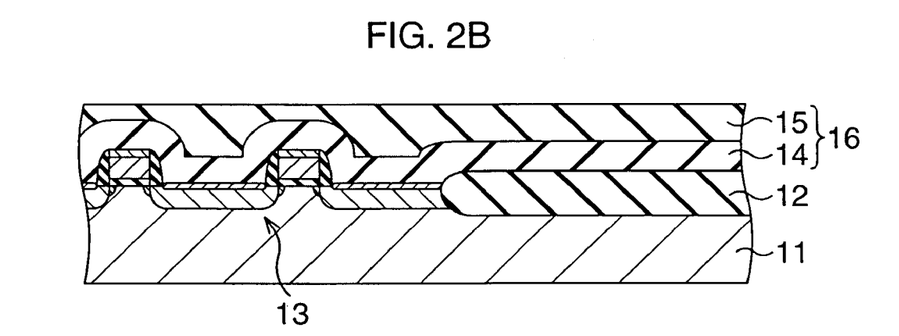

Next, as shown in FIG. 2B, the $SiO_2$ film 15 is polished from the top thereof by chemical mechanical polishing (CMP) to be planarized so that the thickness of a first interlayer insulation film 16 with reference to the interface thereof with the element isolation insulating film 12 becomes, for example, 785 nm.

Figure 2C:
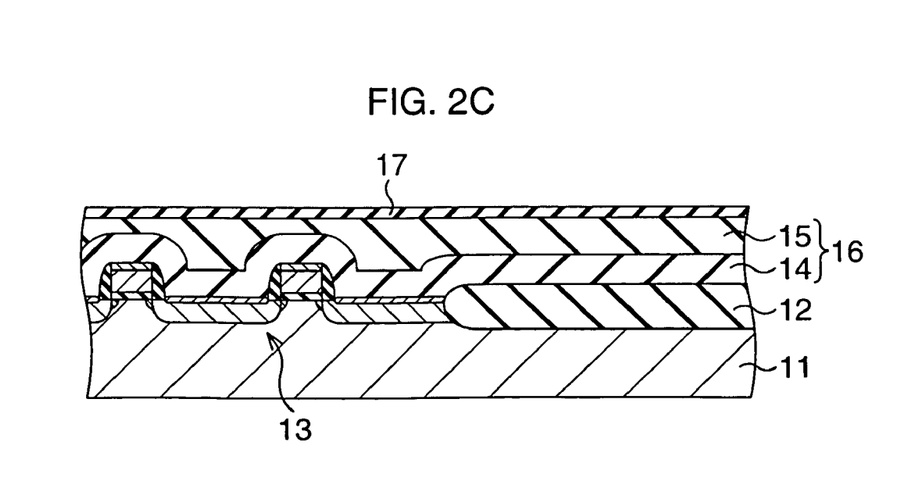

Subsequently, as shown in FIG. 2C, a $SiO_2$ cap film 17 (silicon oxide film) is formed on the $SiO_2$ film 15 by a CVD method. As the reaction gas in this event, for example, TEOS is used. Besides, the thickness of the $SiO_2$ cap film 17 is preferably 300 nm or less, and is set to be, for example, 100 nm. Thereafter, annealing is performed for 30 minutes at 650° C. in a $N_2$ atmosphere, thereby performing sufficient degassing (dewatering) of the first interlayer insulation film 16 and the $SiO_2$ cap film 17. Note that it is preferable to set the heat treatment temperature in this event to 650° C. or less. This is because if the heat treatment temperature is above 650° C., the switching electric charge amount may decrease due to stress.

Thereafter, an $Al_2O_3$ film 18 is formed on the $SiO_2$ cap film 17 by a high frequency sputtering method. The thickness of the $Al_2O_3$ film 18 is, for example, 20 nm. Film forming conditions in this event are shown in Table 1.

TABLE 1

| Gas pressure | Ar gas flow rate | RF power | Time |
| --- | --- | --- | --- |
| 0.7 Pa | 20 sccm | 2.0 kW | 40 seconds |

Figure 2D:
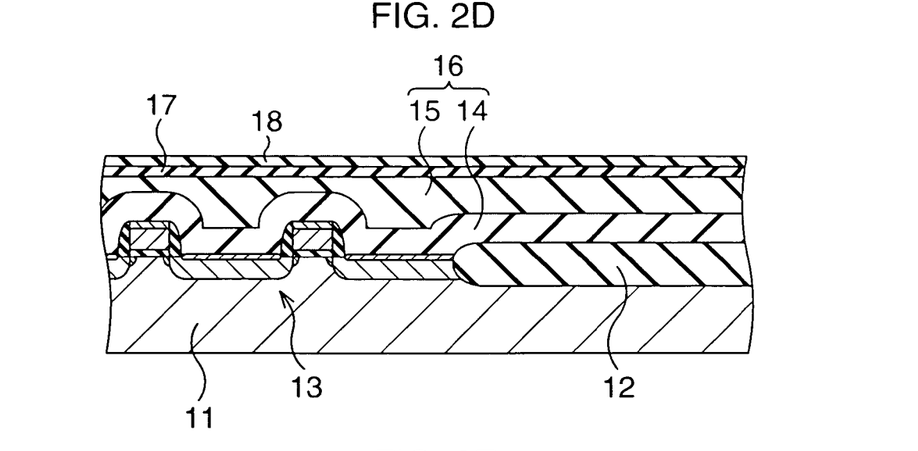

Subsequently, heat treatment is performed for 60 seconds at 650° C. in an $O_2$ atmosphere using an RTA apparatus to subject the surface of the $Al_2O_3$ film 18 to sufficient thermal oxidation, thereby preventing excessive aluminum from existing on the surface of the $Al_2O_3$ film 18. In this heat treatment, it is preferable to set the temperature thereof to a temperature not higher than the temperature at which the degassing has been performed on the first interlayer insulation film 16 and the $SiO_2$ cap film 17. This is because if the heat treatment is performed at a temperature higher than this temperature, the platinum film subsequently formed on the $Al_2O_3$ film 18 degrades in crystallinity. It is conceivable that this is because when heat treatment is performed at a high temperature on the $Al_2O_3$ film 18, moisture escapes from the first interlayer insulation film 16 and the $SiO_2$ cap film 17 and comes to be contained in the $Al_2O_3$ film 18. Besides, in this heat treatment, a typical heating furnace may be used.

Figure 2E:
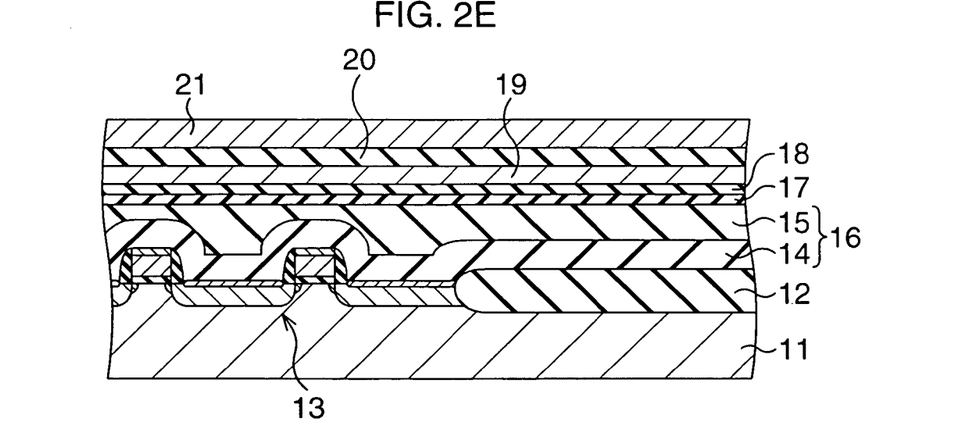

Next, as shown in FIG. 2E, a platinum film 19 (lower electrode film) which will be a lower electrode of the ferroelectric capacitor is formed on the $Al_2O_3$ film 18 by a sputtering method. The thickness of the platinum film 19 is, for example, 150 nm. Film forming conditions in this event are shown in Table 2.

TABLE 2

| Ar gas pressure | DC power | Time | Temperature |
| --- | --- | --- | --- |
| 0.6 Pa | 0.5 kW | 180 seconds | 450° C. |

Subsequently, similarly shown in FIG. 2E, a PLZT (ferroelectric) film 20 which will be a capacity insulation film of the ferroelectric capacitor is formed in an amorphous phase on the platinum film 19 by a sputtering method. The thickness of the PLZT film 20 is, for example, 150 nm. Film forming conditions in this event are shown in Table 3.

TABLE 3

| Ar gas pressure | RF power | Time |
| --- | --- | --- |
| 0.7 Pa | 1.0 kW | 260 seconds |

Thereafter, rapid thermal treatment for 90 seconds at 585° C. is performed with a temperature-rising speed from room temperature of 125° C./sec in a mixed atmosphere of argon and $O_2$ with an $O_2$ concentration of 2.5 vol %. The thermal treatment at a low temperature in an inactive atmosphere described above crystallizes the PLZT film 20, so that the crystals of the PLZT film 20 are preferentially oriented in a desirable <111> direction.

Subsequently, similarly shown in FIG. 2E, an iridium oxide ($IrO_2$) film 21 (upper electrode film) which will be an upper electrode of the ferroelectric capacitor is formed on PLZT film 20 by a sputtering method. The thickness of the $IrO_2$ film 21 is, for example, 200 nm. Film forming conditions in this event are shown in Table 4.

TABLE 4

| Gas pressure | Ar gas flow rate | $O_2$ gas flow rate | DC power | Time |
| --- | --- | --- | --- | --- |
| 0.8 Pa | 100 sccm | 63 sccm | 2.0 kW | 30 seconds |

The reason why $IrO_2$, which is a conductive oxide, is used here as the upper electrode film is to suppress hydrogen-induced degradation of the PLZT film 20, but a platinum film, a $SrRuO_3$ (SRO) film and so on may be used as the upper electrode film. However, since platinum has catalysis with respect to hydrogen molecules, platinum is likely to generate hydrogen radical and thus tends to reduce and degrade the PLZT film 20. Therefore, it cannot be said that the use of platinum is not preferable. In contrast to this, $IrO_2$ and SRO have no catalysis and thus hardly generate hydrogen radical and hardly cause hydrogen-induced degradation of the PLZT film 20.

Next, rapid thermal treatment for 20 seconds at 725° C. is performed with a temperature-rising speed of 125° C./sec in a mixed atmosphere of argon and $O_2$ with an $O_2$ concentration of 1 vol %. As described above, when the crystallization of the PLZT film 20 is performed at a low temperature of 585° C., the crystals in the PLZT film 20 are oriented in the <111> direction. By further performing thermal treatment on this PLZT film 20 in an $O_2$ atmosphere, the oxygen deficiency in the crystal lattice of the PLZT film 20 is replenished and the PLZT film 20 is densified.

Note that if the thermal treatment for densifying the PLZT film 20 is performed before the formation of the $IrO_2$ film 21, a large amount of bubbles existing in the PLZT film 20 gather to one place. This state when viewed from the surface presents such appearance that a pinhole opens in the grain boundary portion of the PLZT film 20. Accordingly, it is not preferable to perform the thermal treatment for densifying the PLZT film 20 before the formation of the $IrO_2$ film 21. In contrast to the above, the thermal treatment for densifying the PLZT film 20 after the formation of the $IrO_2$ film 21 as in this embodiment prevents surface roughness of the PLZT film 20 so that the surface of the PLZT film 20 becomes smooth, resulting in very high flatness of the interface between the PLZT film 20 and the $IrO_2$ film 21. Therefore, it is conceivable that defects likely to occur at this interface also decrease. Further, lead (Pb) and PbO having a high vapor pressure tend to desorb from the PLZT film 20 in a thermal treatment, but this embodiment, in which the PLZT film 20 is covered with the $IrO_2$ film 21 in the thermal treatment, also provides an effect of preventing desorption of lead and so on.

Figure 2F:
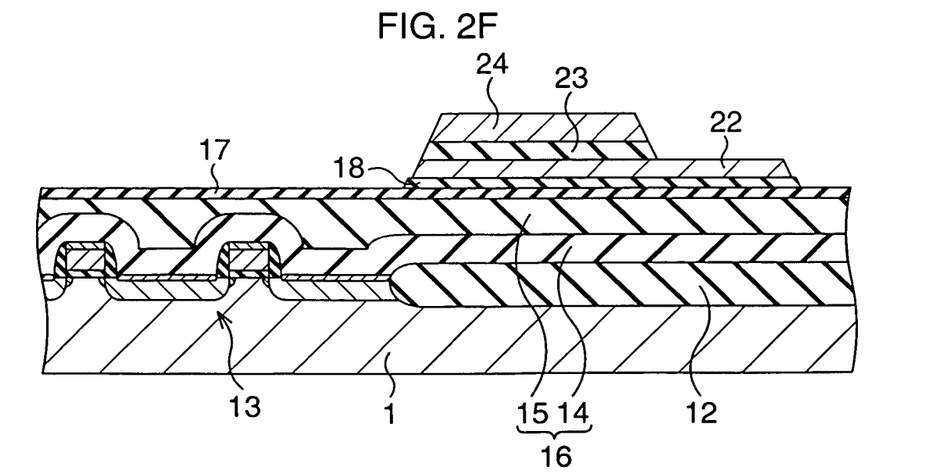

After the densification of the PLZT film 20, a resist pattern (not shown) having a pattern form of the upper electrode of the ferroelectric capacitor is formed on the $IrO_2$ film 21, and the $IrO_2$ film 21 is etched using the resist pattern as a mask. As a result of this, an upper electrode 24 is obtained from the $IrO_2$ film 21 as shown in FIG. 2F. Next, the resist pattern is removed and a new resist pattern (not shown) having a pattern form of a capacity insulation film of the ferroelectric capacitor is formed, and the PLZT film 20 is etched using the resist pattern as a mask. As a result of this, as shown in FIG. 2F, a capacity insulation film 23 is obtained from the PLZT film 20. Further, the resist pattern is removed, a new resist pattern (not shown) having a pattern form of the lower electrode of the ferroelectric capacitor is formed, and the platinum film 19 and the $Al_2O_3$ film 18 are etched using the resist pattern as a mask. As a result of this, as shown in FIG. 2F, the lower electrode 22 is obtained from the platinum film 19, so that the ferroelectric capacitor is formed.

Figure 2G:
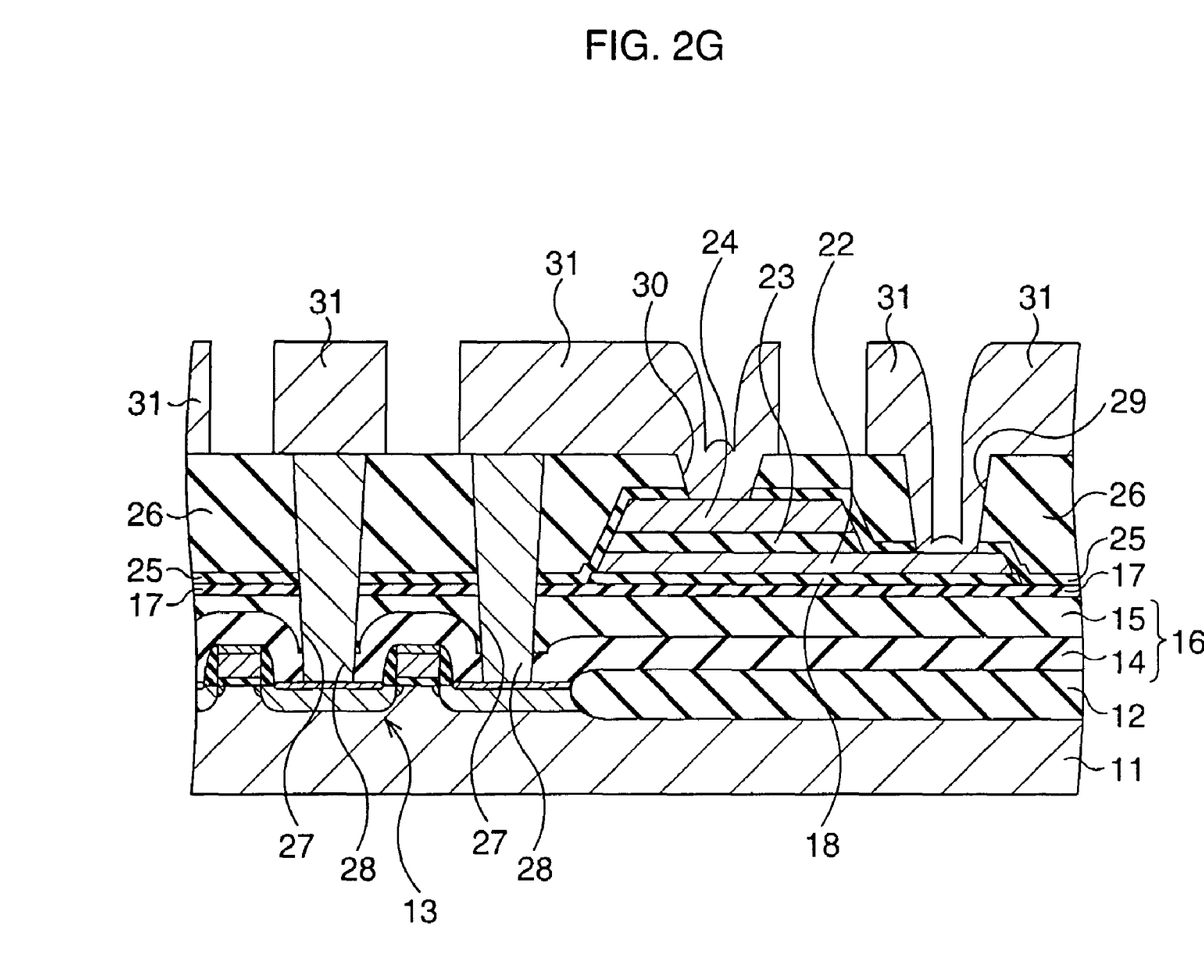

Subsequently, as shown in FIG. 2G, a PLZT film likely to trap hydrogen is formed as a protective film 25 on the entire surface by a sputtering method to protect from hydrogen the capacity insulation film 23 formed of PLZT, which is susceptible to reduction by hydrogen. The thickness of the protective film 25 is, for example, 50 nm. Thereafter, a $SiO_2$ film 26 is formed as a second interlayer insulation film on the entire surface by a CVD method. The thickness of the $SiO_2$ film 26 is, for example, 1500 nm. Subsequently, the $SiO_2$ film 26 is planarized by CMP.

Subsequently, contact holes 27 reaching the silicide layers on the source/drain diffusion layers of the CMOS transistors are formed by dry etching in the $SiO_2$ film 26, protective film 25, $SiO_2$ cap film 17, $SiO_2$ film 15, and oxidation preventing film 14, using a resist pattern (not shown) with a predetermined figure as a mask.

Next, the resist pattern is removed and a titanium film and a TiN film are formed as an adhesion layer in the contact holes 27, and thereafter tungsten films are further buried. Then, CMP is performed on the conductive films to leave conductive plugs 28 composed of the adhesion layer and tungsten film in the contact holes 27.

Subsequently, a contact hole 30 reaching the upper electrode 24 and a contact hole 29 reaching the lower electrode 22 are formed in the $SiO_2$ film 26 and the protective film 25 by dry etching, using another resist pattern (not shown) with a predetermined figure as a mask.

Thereafter, the resist pattern is removed, and an aluminum wiring 31 including portions connecting the diffusion layer constituting the CMOS transistor 13 and the upper electrode 24 and so on is formed on the $SiO_2$ film 26.

Then, although not shown, formation of an interlayer insulation film, formation of a contact plug, and formation of wirings in a second layer from the bottom and thereafter, and so on are further performed. Then, for example, a cover film composed of a TEOS oxide film and a SiN film is formed to complete the ferroelectric memory having the ferroelectric capacitors.

According to the first embodiment described above, since the $SiO_2$ cap film 17 is formed on the first interlayer insulation film 16 before the formation of the $Al_2O_3$ film 18, the flatness of the $Al_2O_3$ film 18 is further improved and the crystallinity of the platinum film 19 formed thereon is further improved. Moreover, since the heat treatment is performed after the formation of the $Al_2O_3$ film 18 to prevent excessive aluminum from existing on the surface of the $Al_2O_3$ film 18, the treatment further improves the crystallinity of the platinum film 19. This results in high reliability. Additionally, there is excellent adhesion between the platinum film 19 and the $Al_2O_3$ film 18, which eliminates the necessity to form the platinum film 19 on a titanium film. Accordingly, the platinum film 19, even though formed at a high temperature, never degrades in orientation, and the platinum film 19 can be formed from columnar crystals with a grain size of about 100 nm to about 150 nm.

Note that the thermal treatment after the formation of the $Al_2O_3$ film 18 may be omitted in the first embodiment. Also in this case, high reliability can be obtained due to the existence of the $SiO_2$ cap film 17.

Second Embodiment

Figure 3A:
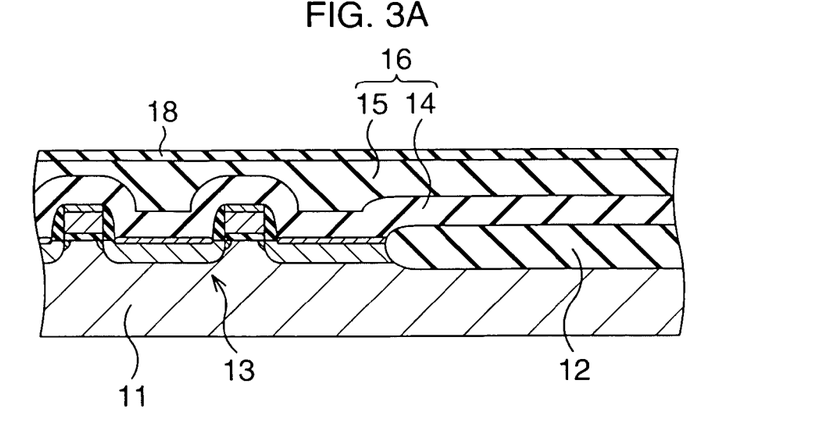
FIGS. 3A to 3C are cross-sectional views showing, in the order of steps, a method for manufacturing a ferroelectric memory according to a second embodiment of the present invention.
Figure 3B:
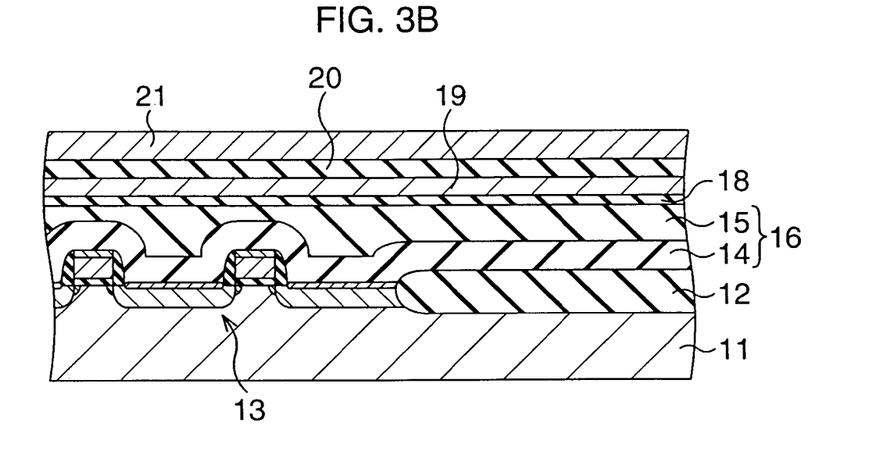
Figure 3C:
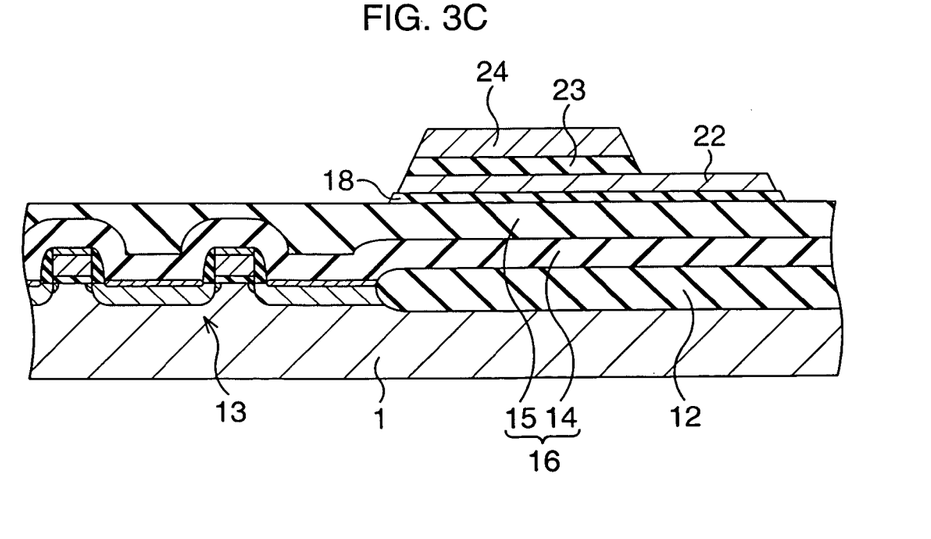

Next, a second embodiment of the present invention will be described. Here, for convenience, a cross sectional structure of a ferroelectric memory will be also described in conjunction with a method for manufacturing the same. FIG. 3A to FIG. 3C are cross-sectional views showing, in the order of steps, a method for manufacturing a ferroelectric memory (semiconductor device) according to the second embodiment of the present invention.

In the second embodiment, as shown in FIG. 3A, a first interlayer insulation film 16 constituted of an oxidation preventing film 14 and a $SiO_2$ film 15 is formed as in the first embodiment, and thereafter annealing is performed for 30 minutes at 650° C. in a $N_2$ atmosphere, thereby performing sufficient degassing (dewatering) of the first interlayer insulation film 16, as in the first embodiment. Note that it is preferable to set the heat treatment temperature in this event to 650° C. or less as in the first embodiment. Then, an $Al_2O_3$ film 18 is formed on the $SiO_2$ cap film 15 without forming a $SiO_2$ cap film 17.

Subsequently, heat treatment is performed for 60 seconds at 650° C. in an $O_2$ atmosphere using an RTA apparatus, as in the first embodiment, to subject the surface of the $Al_2O_3$ film 18 to sufficient thermal oxidation, thereby preventing excessive aluminum from existing on the surface of the $Al_2O_3$ film 18.

Next, as shown in FIG. 3B, a platinum film 19 (lower electrode film), a PLZT film 20, and an $IrO_2$ film 21 are sequentially formed on the $Al_2O_3$ film 18 as in the first embodiment, and heat treatment after the formation of the $IrO_2$ film 21 is further performed to densify the PLZT film 20.

Then, as shown in FIG. 3C, patterning of the $IrO_2$ film 21, PLZT film 20, platinum film 19, and $Al_2O_3$ film 18 is performed as in the first embodiment to form a ferroelectric capacitor.

Thereafter, through the processes similar to those in the first embodiment, the ferroelectric memory having the ferroelectric capacitors is completed.

In the second embodiment described above, since no $SiO_2$ film 17 is formed but the heat treatment is performed after the formation of the $Al_2O_3$ film 18 to prevent excessive aluminum from existing on the surface of the $Al_2O_3$ film 18, the crystallinity of the platinum film 19 is improved, resulting in high reliability.

Next, results of an experiment actually conducted by the present inventors will be explained.

The experiment was conducted in the following manner. First, a CMOS transistor was formed on a semiconductor substrate, and an interlayer insulation film covering the CMOS transistor was formed by a CVD. Then, the surface of the interlayer insulation film was planarized, and treatments shown in Table 5 were carried out. In the formation of a silicon oxide film ($SiO_2$ cap film), a silicon oxide film with a thickness of 100 nm was formed. In the heat treatment of the silicon oxide film (including the interlayer insulation film), heat treatment was performed for 30 minutes at 650° C. in a $N_2$ atmosphere. In the formation of an aluminum oxide film ($Al_2O_3$ film), an aluminum oxide film with a thickness of 20 nm was formed. In the heat treatment of the aluminum oxide film, heat treatment was performed for 60 seconds at 650° C. in an $O_2$ atmosphere using an RTA apparatus. A platinum film was formed on them, and the crystallinity of the platinum film was examined.

TABLE 5

| | Sample No. | | | | |
|---|---|---|---|---|---|
| | 1 | 2 | 3 | 4 | 5 |
| Formation of Si oxide film | No | No | No | Yes | Yes |
| Heat treatment of Si oxide film | Yes | Yes | Yes | Yes | Yes |
| Formation of Al oxide film | Yes | Yes | Yes | Yes | Yes |
| Heat treatment of Al oxide film | No | Yes | Yes | No | Yes |

In the examination of the crystallinity, the integrated intensity of platinum (222) peak of each sample was measured by an X-ray diffraction method. The measurement points were at the central portion and peripheral portion of a wafer. Besides, regarding the central portion of the wafer, rocking curve measurement was performed for the platinum (222) peak to measure the FWHM (Full Width at Half Maximum) of the peak. A higher integrated intensity represents that the crystals of platinum are more uniform, indicating excellent crystallinity. Besides, a smaller FWHM (Full Width at Half Maximum) represents that the crystals of platinum are uniform, indicating excellent crystallinity. These results are shown in FIG. 4 and FIG. 5.

Figure 4:
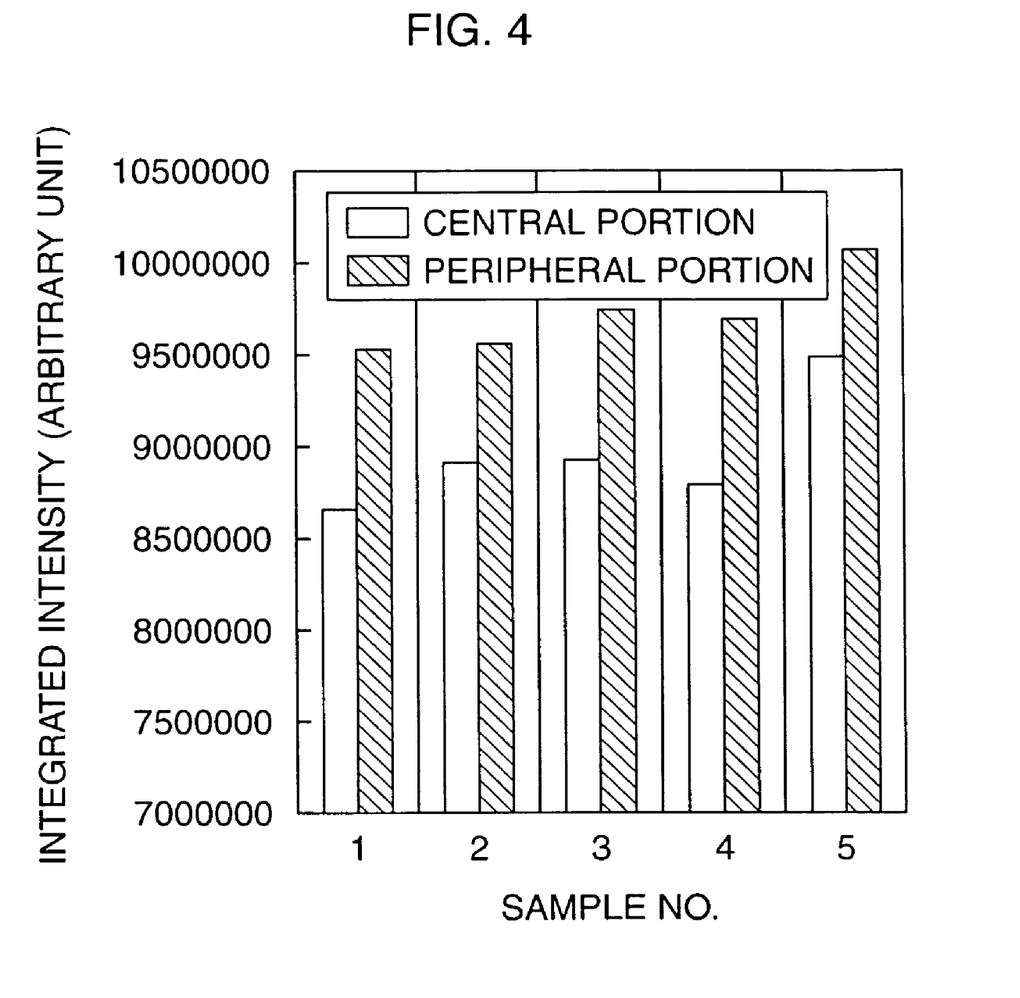
FIG. 4 is a graph showing the integrated intensity of platinum (222) peak of each sample.
Figure 5:
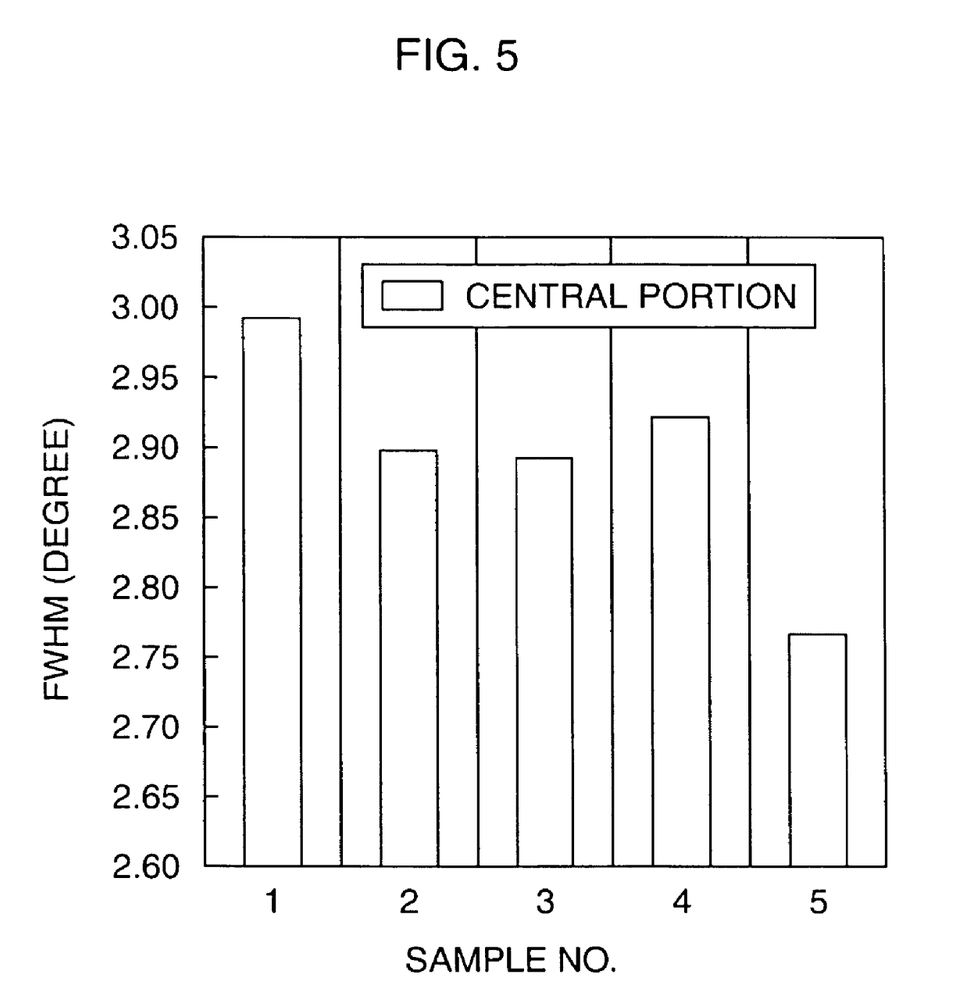
FIG. 5 is a graph showing the FWHM (Full Width at Half Maximum) of each sample.

As shown in FIG. 4 and FIG. 5, because of the performance of heat treatment on the aluminum oxide film, Samples No. 2 and No. 3 were high in integrated intensity and small in FWHM (Full Width at Half Maximum) as compared with Sample No. 1, which was produced by a method corresponding to the conventional method. This shows that Samples No. 2 and No. 3 are more excellent in crystallinity than Sample No. 1. It should be noted that the same treatment was performed on Samples No. 2 and No. 3, and this is to check repeatability.

Besides, Sample No. 4, in which no heat treatment was performed on the aluminum oxide film, was provided with a silicon oxide film formed therein and thus high in integrated intensity and small in FWHM (Full Width at Half Maximum), as compared with Sample No. 1, showing excellent crystallinity.

Further, Sample No. 5, in which a silicon oxide film was formed and heat treatment was performed on the aluminum oxide film, was thus very high in integrated intensity and very small in FWHM (Full Width at Half Maximum) due to synergistic effects, showing very excellent crystallinity.

Note that the X-ray diffraction intensity was weaker at the central portion than at the peripheral portion as shown in FIG. 4, and this can be considered to be caused by the thickness of the platinum film larger at the peripheral portion.

Further, the present inventors produced another sample by performing the same treatment as performed on Samples No. 2 and No. 3 except that the temperature of heat treatment of aluminum oxide film was set to 750° C. and examined the crystallinity of this sample to obtain a result that the sample is superior to Sample No. 1 but slightly inferior to Samples No. 2 and No. 3. It can be considered that this is because degassing occurred during the heat treatment of the aluminum oxide film due to the heat treatment temperature of the aluminum oxide film made higher than the silicon oxide film heat treatment temperature.

It should be noted that the present invention is not limited to the above-described embodiments. For example, SBT, SBTN and so on may be used as the ferroelectric material, in addition to PZT and PLZT. Further, the method for forming the ferroelectric film is not limited to the MOCVD method, but other film forming methods such as, for example, a sol-gel method, a sputtering method, and so on may be used. Further, not only a stack-structure type but also a planar-structure type may be formed as the ferroelectric capacitor.

Besides, the semiconductor device to which the present invention is applied is not limited to the above-described ferroelectric memory, and the present invention is applicable to those as long as they have ferroelectric capacitors. For example, the present invention is also applicable to a dynamic random access memory (DRAM) and so on.

According to the present invention, when forming a lower electrode of a ferroelectric capacitor, the state of an aluminum oxide film existing under the ferroelectric capacitor, that is, a base film of the ferroelectric capacitor can be brought into a state so that the lower electrode has excellent orientation. Accordingly, the ferroelectric capacitor can be enhanced in reliability.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A semiconductor device, comprising:
an interlayer insulation film with a surface planarized;
a silicon oxide film formed on said interlayer insulation film;
an aluminum oxide film formed on said silicon oxide film; and
a ferroelectric capacitor formed on said aluminum oxide film, wherein said aluminum oxide film and said ferroelectric capacitor contact each other.

2. The semiconductor device according to claim 1, wherein said ferroelectric capacitor has a lower electrode including a platinum film.

3. The semiconductor device according to claim 1, further comprising a transistor connected to said ferroelectric capacitor.

4. A method for manufacturing a semiconductor device, comprising the steps of:
forming an interlayer insulation film above a semiconductor substrate;
planarizing a surface of the interlayer insulation film;
forming a silicon oxide film on the interlayer insulation film;
heating the silicon oxide film and the interlayer insulation film to remove moisture from the silicon oxide film and the interlayer insulation film;
forming an aluminum oxide film on the silicon oxide film; and
forming a ferroelectric capacitor on the aluminum oxide film, wherein said aluminum oxide film and said ferroelectric capacitor contact each other.

5. The method for manufacturing a semiconductor device according to claim 4, further comprising, between said step of forming an aluminum oxide film and said step of forming a ferroelectric capacitor, the step of heating the aluminum oxide film in an oxidation atmosphere.

6. The method for manufacturing a semiconductor device according to claim 4, wherein a thickness of the silicon oxide film is 300 nm or less.

7. The method for manufacturing a semiconductor device according to claim 5, wherein a heat treatment temperature in said step of heating the silicon oxide film and the interlayer insulation film is 650 or lower.

8. The method for manufacturing a semiconductor device according to claim 5, wherein a heat treatment temperature in said step of heating the aluminum oxide film is not higher than a heat treatment temperature in said step of heating the silicon oxide film and the interlayer insulation film.

9. A method for manufacturing a semiconductor device, comprising the steps of:
forming an interlayer insulation film above a semiconductor substrate;
planarizing a surface of the interlayer insulation film;
forming an aluminum oxide film on the interlayer insulation film;
heating the aluminum oxide film in an oxidation atmosphere; and
after said step of heating begins, forming a ferroelectric capacitor on the aluminum oxide film.

10. The method for manufacturing a semiconductor device according to claim 9, further comprising, between said step of planarizing a surface of the interlayer insulation film and said step of forming an aluminum oxide film, the step of heating the interlayer insulation film to remove moisture from the interlayer insulation film.

11. The method for manufacturing a semiconductor device according to claim 10, wherein a heat treatment temperature in said step of heating the interlayer insulation film is 650 or lower.

12. The method for manufacturing a semiconductor device according to claim 10, wherein a heat treatment temperature in said step of heating the aluminum oxide film is not higher than a heat treatment temperature in said step of heating the interlayer insulation film.

13. The method for manufacturing a semiconductor device according to claim 4, further comprising, prior to said step of forming an interlayer insulation film, the step of forming a transistor to be connected to the ferroelectric capacitor on a surface of the semiconductor substrate.

14. The method for manufacturing a semiconductor device according to claim 9, further comprising, prior to said step of forming an interlayer insulation film, the step of forming a transistor to be connected to the ferroelectric capacitor on a surface of the semiconductor substrate.

15. The method for manufacturing a semiconductor device according to claim 4, wherein the aluminum oxide film is formed by a high frequency sputtering method.

16. The method for manufacturing a semiconductor device according to claim 9, wherein the aluminum oxide film is formed by a high frequency sputtering method.

17. The method for manufacturing a semiconductor device according to claim 4, wherein said step of forming a ferroelectric capacitor comprises the step of forming a lower electrode including a platinum film.

18. The method for manufacturing a semiconductor device according to claim 9, wherein said step of forming a ferroelectric capacitor comprises the step of forming a lower electrode including a platinum film.

* * * * *